United States Patent [19]
Kamakura et al.

[11] Patent Number: 5,755,877
[45] Date of Patent: May 26, 1998

[54] METHOD OF GROWING THIN FILM ON SEMICONDUCTOR SUBSTRATE AND ITS MANUFACTURING APPARATUS

[75] Inventors: Takanobu Kamakura, Yokosuka; Norihiko Tsuchiya, Setagaya-ku, both of Japan

[73] Assignee: Kabushiki Kaisha Toshiba, Kawasaki, Japan

[21] Appl. No.: 650,021

[22] Filed: May 17, 1996

Related U.S. Application Data

[63] Continuation of Ser. No. 352,024, Nov. 30, 1994, abandoned.

[30] Foreign Application Priority Data

Nov. 30, 1993 [JP] Japan .................... 5-299551

[51] Int. Cl.[6] .................................. C30B 25/16
[52] U.S. Cl. .................. 117/85; 117/86; 117/202; 438/141; 118/715
[58] Field of Search ............... 117/85, 86, 202; 437/7; 118/715; 438/141

[56] References Cited

U.S. PATENT DOCUMENTS

| | | |
|---|---|---|
| 5,148,457 | 9/1992 | Kubota et al. |
| 5,249,216 | 9/1993 | Ohsugi et al. ............. 378/46 |
| 5,432,124 | 7/1995 | Nishikata et al. ............. 437/133 |
| 5,461,559 | 10/1995 | Heyob et al. ............. 364/149 |

OTHER PUBLICATIONS

S. Brennan et al., "X-Ray Spectroscopic Studies of Organo-Metallic Vapor Phase Epitaxial Growth," Mat. Res. Soc. Symp. Proc. vol. 312, (1993), pp. 165–171.

R.I. Hegde et al., "Nucleation and growth of cvd TiN films on Si (100) as studied by total reflection x-ray fluorescence, atomic force microscopy, and Auger electron spectroscopy," J. Vac. Sci. Tech. A, vol. 11, No. 4, Jul./Aug. 1993, pp. 1692–1695.

Y.C. Sasaki et al., "New technique for evaluation of surfaces and interfaces at atmospheric pressure by using refracted X-ray fluorescence (RXF)," Applied Surface Science 47 (1991), pp. 371–374.

B.J. Cross, et al., "New Methods for High-Performance X-Ray Fluorescence Thickness Measurements," Plating and Surface Science, Aug. 1988, pp. 68–74.

V.P. Kononov et al., "Molecular Beam Epitaxy of Fe/Cu Multilayered Films and its Magnetooptical Properties," International Journal of Modern Physicl B, vol. 1, (Jul. 20–24, 1992), pp. 466–469.

*Primary Examiner*—Robert Kunemund
*Attorney, Agent, or Firm*—Oblon, Spivak, McClelland, Maier & Neustadt, P.C.

[57] ABSTRACT

In an extremely thin hetero-epitaxial growth film less than 1 μm, the thin film can be grown at high precision by controlling the growth conditions. The method of growing a thin film on a semiconductor substrate comprises the steps of: forming a semiconductor thin film on a surface of a semiconductor substrate; allowing X-rays to be incident upon the thin film now being grown; measuring fluorescent X-rays emitted from the thin film now being grown in accompany with the application of the X-rays; and controlling growth conditions of the thin film on the basis of the measured values.

18 Claims, 4 Drawing Sheets

METHOD OF GROWING THIN FILM ON SEMICONDUCTOR SUBSTRATE AND ITS MANUFACTURING APPARATUS

This application is a Continuation of application Ser. No. 08/352,024, filed on Nov. 30, 1994, now abandoned.

FIELD OF THE INVENTION

The present invention relates to a method of growing a thin film on a semiconductor substrate and an apparatus for manufacturing the same.

BACKGROUND OF THE INVENTION

Recently, with the advance of higher function and higher operation speed of the semiconductor devices, higher epitaxial growth technique has been required more and more. This tendency is particularly prominent in the field of semiconductor devices, and the method of manufacturing epitaxial wafer of MQW (multi quantum well) or MODFET structure by the most use of hetero-epitaxial growth technique has been widely adopted. The features of the epitaxial growth film reside in use of multi-component elements and thin film, and further in a reduction of residual impurities.

Accordingly, it is extremely difficult to achieve the characteristic evaluation, for instance to evaluate the thin film growing conditions and the film thickness of a grown wafer.

To form an epitaxial growth film, vapor phase epitaxy is adopted in usual, which can be roughly classified into molecular beam epitaxy (MBE) and organometal chemical vapor deposition (MOCVD). A big difference between the two resides in the film growth in a vacuum ~$1.33 \times 10^{-10}$ hPa (~$10^{-10}$ torr) or under almost the atmospheric pressure.

The MBE technique is now mainly adopted in the field of search and development as an effective method of controlling the thickness a growing film. In this technique, conventionally the film growth is sensed for each atomic layer by allowing a high speed electron beam to be incident upon a growing film and further by monitoring change in strengths of surface reflection and diffraction, which is referred to as a reflection high speed electron beam diffraction (RHEED).

FIG. 4 is a waveform diagram showing an example of film thickness measured in accordance with this RHEED technique, in which the relationship between the growing time and the reflected electron beam intensity is shown. In FIG. 4, one period of the reflection strength vibration corresponds to one atomic-layer growth. Therefore, it is possible to know the thickness of a grown film by counting the number of vibrations of the reflection strength, and thereby it is possible to control the thickness of the grown film.

On the other hand, in the MOCVD technique, since the film is grown under almost the atmospheric pressure, it is difficult to evaluate and control the growing layer by use of an electron beam as with the case of the MBE technique. To overcome this problem, therefore, the following destructive method (destruction of a grown film) has been widely adopted. For instance, a film thickness is decided by observing the cross section of the film with the use of a transparent electron microscope (TEM). In this case, the film thickness is controlled on the basis of the grown speed (obtained by calculation of the epitaxial time in relationship to the growing parameter) and the growth parameters (e.g., time, reactive gas flow rate, etc.) in this growing condition. In addition, SIMS technique is also adopted as one of the destructive methods.

As described above, as the control method of film thickness in the vapor phase epitaxy, there have been so far known a direct control method such that the film thickness is measured for each layer growth, and the film growth is stopped at a desired film thickness; and an indirect control method such that the growth conditions are controlled to obtain a desired film thickness.

However, the above-mentioned conventional thin film growing methods involve the following problems:

In the case of the direct control method, although this technique is an effective evaluation method having such an advantage that each atomic layer growth can be monitored (as referred to as a high precise film thickness control method), there still exist various restrictions as follows:

First, since an electron beam is used, a high vacuum of $1.33 \times 10^{-6}$ hPa ($10^{-6}$ Torr) or less is required, so that it is impossible to observe the film growth progressing near at the atmospheric pressure. Secondly, since the diffraction based upon the grating the structure surface atomics is used, the position of a diffraction image is shifted in hetero epitaxial growth of distorted grating system, so that it is difficult to obtain an accurate reflection intensity. Thirdly, since the vibration of the reflection intensity is caused by the roughness of the atomic order, various problems arise: the flatness of the growth surface is degraded with increasing growth film thickness; the vibration strength decreases for each substrate due to the orientation offset of the substrate (e.g., due to offset angle away from orientation of [100]). Fourthly, in the case of hetero growth, since a secondary diffraction image appears due to surface rearrangement, so that the obtained analysis image is complicated and thus the vibration period is difficult to identify.

As described above, the film thickness control technique based upon the direct control is limited in the applicable field, so the this technique is used only the research and development field, without being used widely in the industrial field.

For the reasons as described above, in the large capacity thin film manufacturing apparatus for industrial mass production, the film thickness control method based upon the indirect control (for controlling time and source temperature, etc.) must be so far adopted.

The indirect control method is widely used in the growth process of a film with thickness of 0.5 μm or more. In this method, the dependency of the parameters (i.e., substrate, reactive gas flow rate, temperature, etc.) upon the growth speed is checked. Further, a thin film with a necessary thickness is grown by changing only the time as the main parameter, while keeping the other specific growth conditions at constant values. In this method, however, since the growth batch (on the basis of which the growth speed is determined) and the production wafer growth batch are different from each other and the device parameters vary in the each batch statistically, so that it is difficult to control a film thickness. To overcome this problem, as the growth speed, an average growth speed is obtained by measuring the thickness of the grown film with the use of cross section TEM (transparent electron microscope) or SEM (scanning electro-microscopy) and by dividing the grown film thickness by the growth time. In this case, however, since the substrate surface temperature and the reactive gas supply fluctuate due to various factors for each batch, the growth speed also fluctuates, with the result that it is difficult to grow a thin film with an excellent reproducibility.

Therefore, in the indirect control method in the industrial field, the present situation is such that the film thickness is evaluated again on the basis of the infrared interference technique in order to manufacture wafers which can satisfy the decided specification or standard. However, this technique is sometimes not suitable for the thin film growth of less than 0.1 µm or for some structures of the epitaxial growth film, so that this indirect control method is used in only a limited field.

Furthermore, the technique used for the indirect control method is of destructive evaluation type, there exist other problems in that the feedback to the succeeding growth process tends to be delayed and thereby the productivity is lowered. That is, the indirect method is not satisfactory from the standpoint of high precise film thickness control, because the grown film thickness inevitably disperses between lots or batches.

Other than the above-mentioned methods, various indirect film thickness control methods of non-destructive type (e.g., by the utilization of laser or a quartz vibrator) have been so far well known. However, these techniques are not yet completed by solving the respective drawbacks and thereby not used in practice in the industrial field.

SUMMARY OF THE INVENTION

With these problems in mind, therefore, it is the object of the present invention to provided a method and apparatus for manufacturing a thin film at high precision.

To achieve the above-mentioned object, the present invention provides a method of growing a thin film on a semiconductor substrate, which comprises the steps of: forming a semiconductor thin film on a surface of a semiconductor substrate; allowing X-rays to be incident upon the thin film now being grown; measuring fluorescent X-rays emitted from the thin film now being grown in accompany with the application of the X-rays; and controlling growth of the thin film on the basis of the measured fluorescent X-ray values.

Further, the present invention provides an apparatus for manufacturing a thin film on a semiconductor substrate, comprising: film growing means having a chamber, for growing a thin film on a surface of a semiconductor substrate accommodated in the chamber; X-ray emitting means for allowing X-rays to be incident upon the thin film now being grown on the semiconductor substrate; fluorescent X-ray detecting measuring means for detecting fluorescent X-rays emitted from the thin film now being grown in accompany with the application of the X-rays and measuring intensity of the emitted fluorescent X-rays in relation to time; and control means for adjusting said film growing means on the basis of the measured values of said fluorescent X-ray detecting measuring means.

In the method and apparatus according to the present invention, the thickness of a thin film is controlled by allowing X-rays to be incident upon a thin film surface now being grown under total reflection conditions; measuring the intensity of fluorescent X-rays radiated from the thin film surface as the consequence thereof; and controlling the thin film growth conditions on the basis of the measurement results.

DETAILED DESCRIPTION OF THE PREFERRED EMBODIMENTS

The embodiment of the thin film manufacturing apparatus according to the present invention will be described hereinbelow with reference to the attached drawings.

Figure 1:
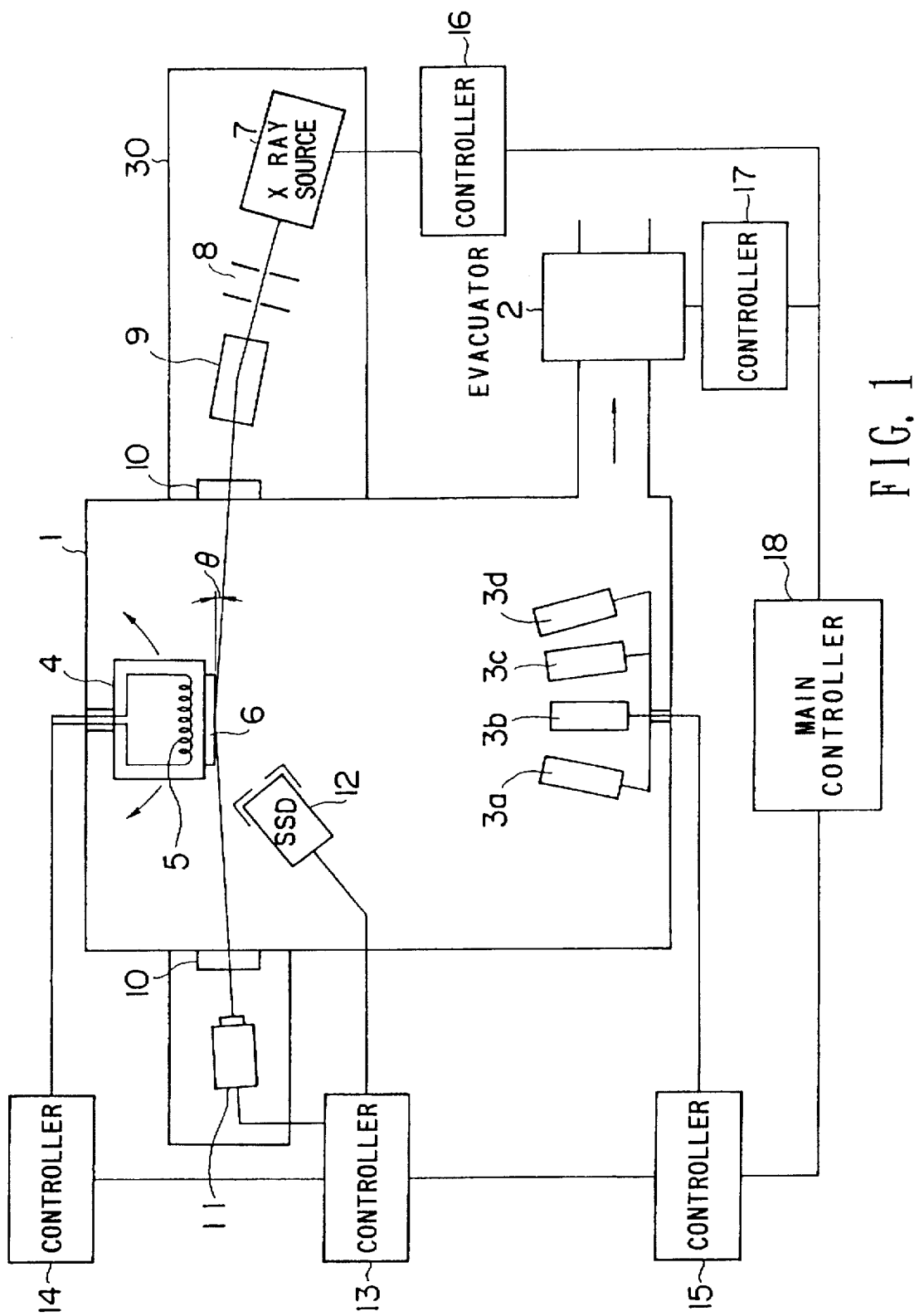
FIG. 1 is a schematic block diagram showing an embodiment of the manufacturing apparatus according to the present invention.

FIG. 1 is a schematic block diagram showing one embodiment of the manufacturing apparatus thereof, which is in particular suitable for epitaxial growth of GaAs based MODFET structure. As shown, a vacuum chamber 1 is evacuated down to the order of $1.33 \times 10^{-11}$ hPa ($10^{-11}$ torr) by an evacuation system 2 controlled by a controller 17. Within the vacuum chamber 1, four Knudsen cells 3a, 3b, 3c and 3d are arranged to supply Ga, As, Al and Si, respectively. A wafer support portion 4 provided with a heater 5 supports a wafer 6 by heating it. In this case, the wafer support portion 4 is provided with a rotating mechanism (not shown) to tilt the wafer with respect to the horizontal position of the vacuum chamber 1 within a range of ±5 degree. The tilt angle of the wafer supporting porion 4 is controlled by a controller 14. An X-ray source 7 is of tungsten target rotary cathode type, which is controlled by a controller 16 and whose capacity is 30 KeV×300 mA. The X-rays from the X-ray source 7 are introduced onto the surface of the wafer 6 through a collimator 8, a monochromator 9 and a BeO-made chamber window 10. Here, an X-ray generating chamber 30 including the X-ray source 7, the collimator 8, the monochromator 9 is evacuated down to $1.33 \times 10^{-6}$ hPa ($10^{-6}$ torr) or less. A detector 11 is used to determine the total reflection conditions of the X-rays reflected from the surface of the wafer 6. An SSD (semiconductor sensing detector) 12 is a solid-state element, for instance for measuring the fluorescent X-rays radiated from the surface of the wafer 6 in accompany with the radiation of the X-rays onto the wafer 6. The detector 11 and the SSD 12 are both connected to a controller 13. Here, the controller 14 is connected to the controller 13 to determine the total reflection conditions on the basis of the tilt angle control of the wafer support portion 4. The controller 15 is connected to the Knudsen cells 3a, 3b, 3c and 3d, respectively to supply or stop the molecular beam on the basis of the intensity of the fluorescent X-rays detected by the SSD 12. The main controller 18 controls the controllers 13, 14, 15, 16 and 17, respectively to automatically control the growth of a thin film formed on the wafer 6.

Figure 2:
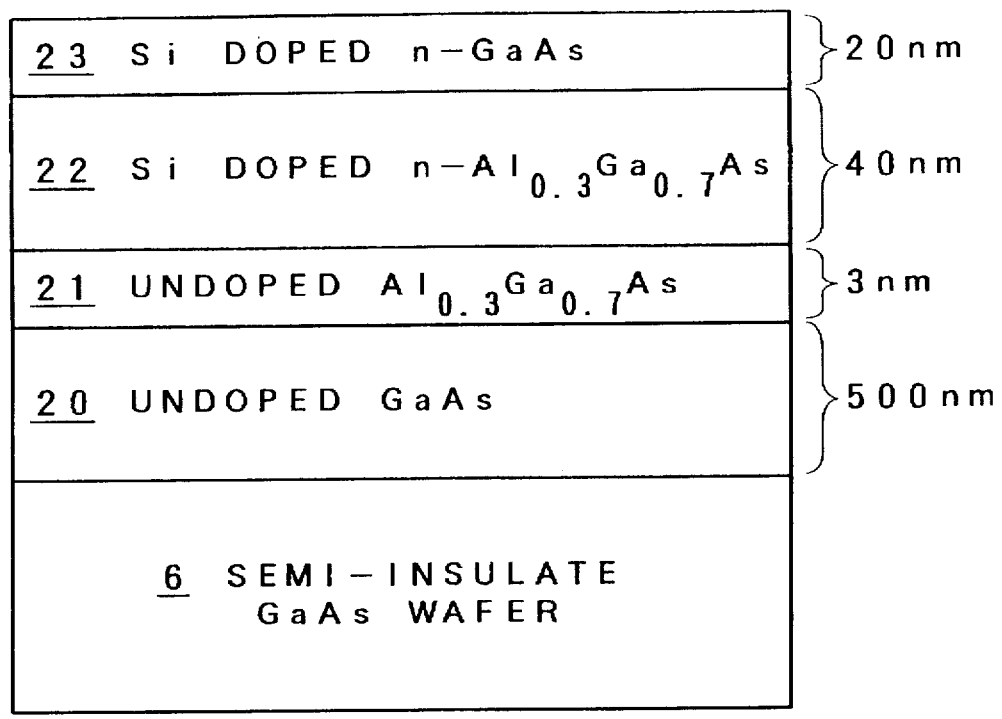
FIG. 2 is a model view showing a GaAs based MODFET structure of a thin film grown by the manufacturing apparatus shown in FIG. 1.

The method of growing a thin film by epitaxial growth with the use of the apparatus shown in FIG. 1 will be explained in accordance with the model view of GaAs based MODFET structure as shown in FIG. 2.

First, the semi-insulated GaAs wafer 6 is supported by the wafer supporting portion 4. Then, the evacuation system 2 is actuated by the controller 17 to evacuate the vacuum chamber 1 down to the order of $1.33 \times 10^{-11}$ hPa ($10^{-11}$ Torr). After that, the wafer 6 is heated by the heater 5 to evaporate a natural oxide film in a As presure condition through Knudsen cell 3b. At the same time, X-rays are generated from the X-ray source 7 under control of the controller 16. The generated X-rays are introduced to the central portion of the wafer 6 through the collimator 8, the monochromator 9 and the chamber window 10. The X-rays reflected by the surface of the wafer 6 are introduced into the detector 11 through another chamber window 10 to measure the intensity of the reflected X-rays. The measured results of the detector 11 are given to the controller 13. The controller 13 determines the total reflection conditions of the X-rays by rotating the wafer supporting portion 4. The critical reflection angle of the ordinal semiconductor material is of 0–2 degrees. Here, since the total reflection angle critical reflection angle of the GaAs with respect to the X-rays is about 0.2 degrees, the tilt angle of the wafer supporting portion 4 is small.

Now, in order to decide the angle θ in FIG. 1, the wafer supporting portion 4 is initially set on the basis of the parallel conditions to the X-rays and the measurement results of the total reflection conditions. After that, the angle θ is set to about 0.05 degrees, and then the intensity of the fluorescent X-ray radiated from the surface of the wafer 6 is counted by the SSD 12 for fluorescent X-ray measurement. (The angle θ is practically set to 0.02–1 degree and set to 1–2 degrees in the case of the thic epitaxial layer. It is of course possible to set the angle θ to 2–5 degrees in the case of the over total reflection condition. Here, a BeO-made window to be attached to the SSD 12 is removed to suppress the absorption on the long wavelength side, so that light elements such as $O_2$ can be measured. In addition, since the whole apparatus is kept under an ultrahigh vacuum condition, it is possible to reduce the scattering of the fluorescent X-rays and thereby to improve the sensitivity.

After a decrease in Ka rays (0.53 eV) of oxygen has been confirmed on the basis of the fluorescent X-ray analysis, that is, after the natural oxide film has been removed, the vapor phase epitaxy starts. Further, here, it is of course necessary to remove heavy metal such as Zn or Cu sticking onto the wafer 6 by the preprocessing such as cleaning and further to confirm that no heavy metal will not be detected.

After that, an undoped GaAs thin film 20 with a thickness of about 500 nm (5000 angstrom) is formed. Since this film growth is of homo-epitaxial growth, although the film thickness cannot be controlled, since the surface of the growing film is being analyzed continuously, it is possible to sense the mixture of impurities by the use of the Knudsen cells 3a, 3b, 3c and 3d, so that it is possible to previously prevent the epitaxial wafer from being contaminated by heavy metal, that is, to prevent a defective wafer from being produced.

The film thickness is controlled in practice whenever each layer is being grown.

Figure 3:
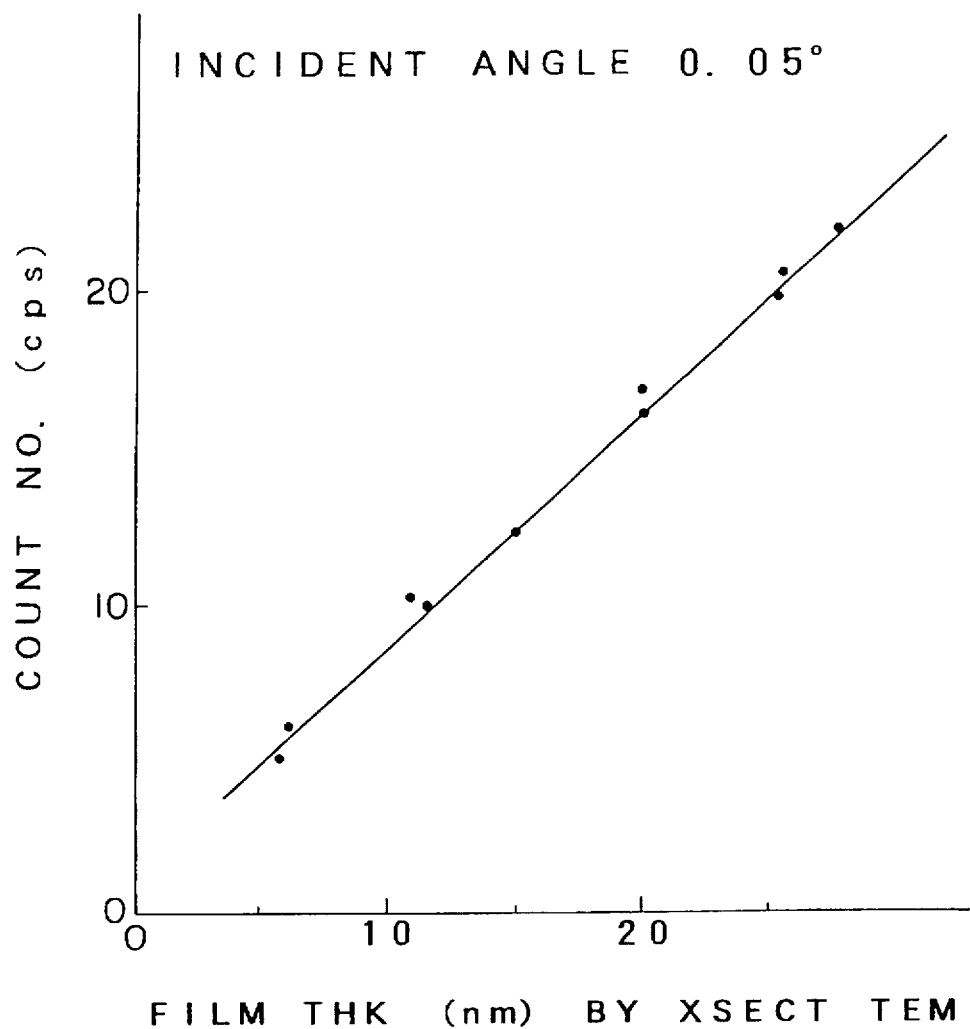
FIG. 3 is a graphical representation showing the film thickness characteristics of interrelation between AlGaAs film thickness obtained by the apparatus shown in FIG. 1 and fluorescent X-rays (AlKα rays), measured by the cross section transparent electron microscope.
Figure 4:
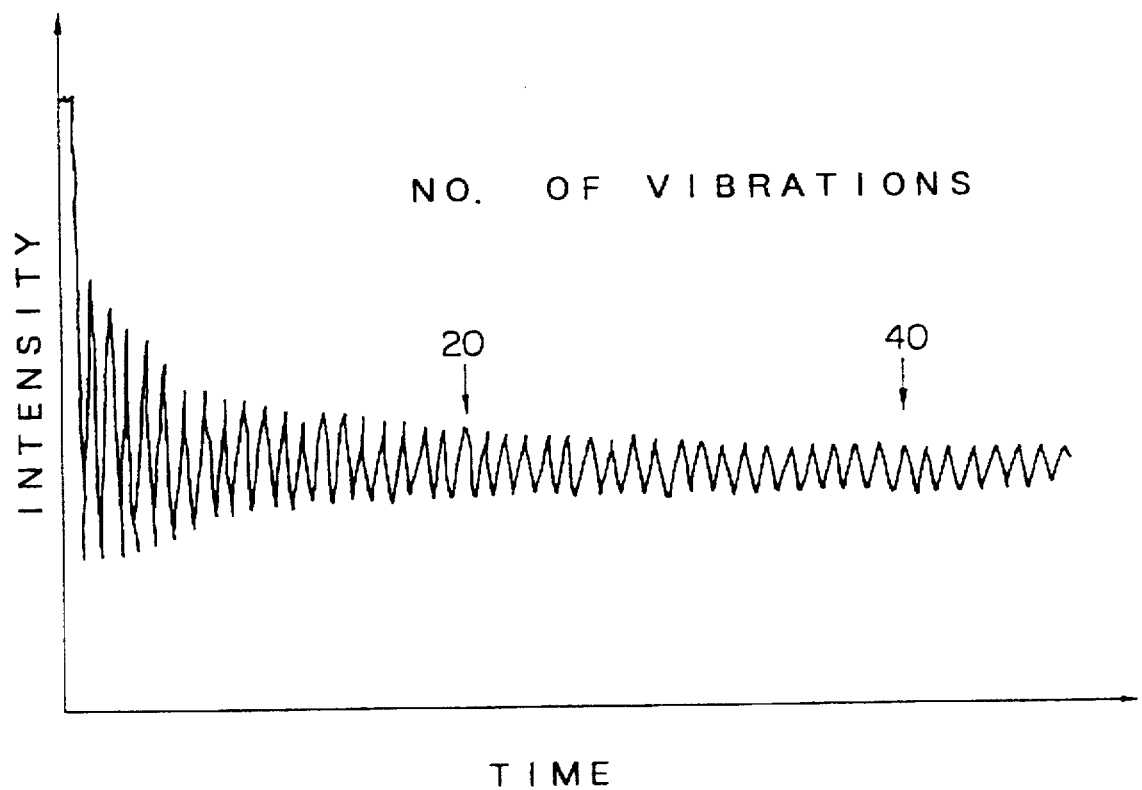
FIG. 4 is a waveform diagram showing an example of the measurement of a film thickness by RHEED technique.

Further, an undoped $Al_{0.3}Ga_{0.7}As$ thin film 21 with a thickness of about 3 nm (30 angstrom) is formed. With the advance of this film growth, a spectrum (1.49 eV) of AlKα rays appears. The thin film 21 is kept grown unit the intensity of this spectrum reaches 5 CPS (counts per second). However, this count value is shown only by way of example, which somewhat differs according to the geometrical arrangement of the respective units in the manufacturing apparatus and the sensitivity of the SSD 12. Further, it is desirable to calibrate the relationship between this spectrum intensity and the film thickness in accordance with the conventional destructive method. In this connection, FIG. 3 shows the film thickness characteristics, that is, the relationship between the fluorescent X-rays (AlKα rays) and the AlGaAs film thickness measured by the cross-section TEM (transparent electron microscope). FIG. 3 indicates that the correlation coefficient between both is as good as 0.998.

Next, a third thin film 22 of Si doped ($5\times10^{18}$ at/cm$^3$) —$Al_{0.3}Ga_{0.7}As$ is grown. In this process, the fluorescent X-rays of Si are mainly monitored, and the fluorescent X-rays of Al are monitored subsidiarily. As the result, in the same way as before, the intensity of the SiKα rays (1.7 eV) increases with increasing film thickness, and the film thickness of about 40 nm (400 angstrom) can be obtained at the intensity of about 10 CPS. Further, the Kα rays of Al measured simultaneously are the fluorescent X-rays to correct the doping efficiency of Si in AlGaAs. In the case of this structure and concentration, the ratio of Si to Al is $5\times10^{-4}$. Therefore, when the measurement values of both deviate from this ratio, this indicates overs or shorts in Si doping, so that it is necessary to stop the film growth of this batch.

Further, a fourth thin film 23 which corresponds to a Si doped ($5\times10^{18}$ at/cm$^3$), $n^+$—GaAs layer is grown to a thickness of about 20 nm (200 angstrom). In this process, the respective intensities of AlKα rays (as the main) and SiKα rays (as the subsidiary) and the ratio of both are measured. Now, the intensity of AlKα decreases with increasing growth of GaAs. When the intensity of AlKα reaches about 1 CPS, the growth step is stopped. This is because even if the X-rays are allowed to be incident under the total reflection conditions, part of the X-rays inevitably reach the AlGaAs layer under the GaAs layer, so that the fluorescent X-rays of Al are generated. However, the quantity of the X-rays reaching the AlGaAs layer decreases with increasing thickness of the GaAs layer, so that the count number decreases. Further, the same can be of course applied to the ratio of SiKα to AlKα in the same way as above.

As described above, it is possible to obtain the intensity of fluorescent X-rays and the intensity change in proportion to the thickness of the grown film, by monitoring the fluorescent X-rays of the main composing element whenever each layer is grown. Accordingly, it is possible to control the film thickness at high precision by controllably stopping the film growth on the basis of standards of the intensity and the intensity change. Further, since the measurement is effected almost under the total reflection conditions, it is possible to evaluate the depth to which the X-rays reach, that is, the film thickness. In the case of Si and GaAs, since the depth is from several to several hundred nm (from several tens to several thousands angstrom), the film thickness can be controlled in accordance with the depth. Further, the above-mentioned method according to the present invention can be applied to another manufacturing apparatus such as organometal chemical vapor deposition (MOCVD) apparatus. In other words, in the method according to the present invention, since X-rays are used, it is possible to obtain the same results as with the case of the molecular beam epitaxy (MBE) apparatus, even under the atmospheric pressure.

Further, in the above-mentioned embodiment, the case where the method is applied to the MODFET structure epitaxial growth has been explained by way of example. However, the method of the present invention can be applied to all the extremely-thin hetero-growth films in further different technical fields.

The method of the present invention has the following excellent features:

(1) Since no electron beam is used, the film thickness can be measured under atmospheric pressure;

(2) Since light (e.g., laser) interference and diffraction are not used, the film thickness from several to several hundred nm (from several tens to several thousands angstrom) can be controlled;

(3) Since the method is of direct measurement technique without destruction, the dispersion of the film thickness according to the growth conditions is extremely small;

(4) Since the method is not electrical measurement, the measurement can be made without regard to the carrier concentration and carrier conductive types; and (5) Since the fluorescent X-rays are used, the elements other than the substrate can be identified and determinated as the impurities required for epitaxial growth, thus enabling a higher fineness.

As described above, in the method according to the present invention, it is possible to evaluate the film thickness of hetero-structure epitaxial growth or multilayer epitaxial (so far evaluated only by destructive method) and further to obtain the film forming method based thereupon. Further, the method of the present invention can be applied widely from the devices such as MODFET, BHT, HBT, etc. to the laser using MQW, and can increase the quality of the epitaxial growth products. In summary, in the method according to the present invention, it is possible to control the thickness of hetero-growth thin films at high precision and high quality.

What is claimed is:

1. A method of growing a multi-layer thin film composed of an under thin film and an upper thin film on a semiconductor substrate, said under thin film having an element which is not included in the upper thin film, which comprises the steps of:

growing the semiconductor thin film on a surface of a semiconductor substrate;

emitting X-rays from an X-ray source with a tungsten target and, while growing the semiconductor thin film, impinging emitted X-rays incident on the multi-layer thin film being grown under a condition of almost total reflection off said substrate;

measuring fluorescent X-rays emitted from the under thin film through the upper thin film being grown, in accompany with the application of the X-rays; and controlling growth of the upper thin film on the basis of the measured fluorescent X-ray values.

2. The method of claim 1, wherein said under thin film comprises aluminum, and the step of measuring fluorescent X-rays comprises measuring an intensity of a spectrum of AlKα.

3. The method of claim 1, wherein in the step of measuring the fluorescent X-rays, intensity of the fluorescent X-rays is measured to detect a thickness of the thin film indirectly on the basis of the measured intensity; and in the step of controlling the growth conditions, the thickness of the thin film is controlled on the basis of the detected thickness of the thin film.

4. The method of claim 1, wherein prior to the step of growing the thin film, a natural oxide film formed on a surface of the semiconductor substrate is removed.

5. The method of claim 4, wherein in the step of removing the natural oxide film, removal of the natural oxide film is detected, by allowing X-rays to be incident upon the surface of the semiconductor substrate to analyze fluorescent X-rays obtained thereby.

6. The method of claim 5, wherein prior to the step of growing the thin film, heavy metal is removed from the surface of the semiconductor substrate.

7. The method of claim 1, wherein in the step of growing the thin film, the thin film is grown under monitoring of mixture of impurities.

8. The method of claim 1, wherein the thin film is formed on a homo-epitaxial layer formed on the surface of the semiconductor surface.

9. The method of claim 8, wherein the homo-epitaxial layer is an undoped GaAs layer; and the multi-layer thin film is composed of an undoped $Al_{0.3}Ga_{0.7}As$ film, a Si-doped $Al_{0.3}Ga_{0.7}As$ film, and a Si-doped GaAs film all being arranged from the homo-epitaxial layer in sequence.

10. The method of claim 9, wherein the undoped $Al_{0.3}Ga_{0.7}As$ film is formed until a spectrum of AlKα becomes a constant intensity in the step of measuring the fluorescent X-rays; the Si-doped $Al_{0.3}Ga_{0.7}As$ film is formed until a spectrum of SiKα becomes a constant intensity in the step of measuring the fluorescent X-rays; and the Si-doped GaAs film is formed until a spectrum of AlKα becomes a constant intensity in the step of measuring the fluorescent X-rays.

11. The method of claim 10, wherein when the Si-doped $Al_{0.3}Ga_{0.7}As$ film is being formed, the intensity of the AlKα is used for correction of the doping rate.

12. The method of claim 1, wherein the respective steps are conducted under reduced pressure.

13. The method of claim 1, wherein the respective steps are conducted under atmospheric pressure.

14. The method of claim 1, wherein the X-rays are incident upon the thin film at 0–2 degrees.

15. The method of claim 1, wherein the X-rays are incident upon the thin film at 0.02–1 degrees.

16. The method of claim 1, wherein the X-rays are incident upon the thin film at 1–2 degrees.

17. The method of claim 1, wherein the X-rays are incident upon the thin film at 2–5 degrees.

18. An apparatus for manufacturing a thin film on a semiconductor substrate, comprising:

film growing means having a chamber, for growing a thin film on a surface of a semiconductor substrate accommodated in the chamber;

X-ray emitting means for allowing X-rays to be incident upon the thin film now being grown on the semiconductor substrate;

fluorescent X-ray detecting measuring means for detecting fluorescent X-rays emitted from the thin film and a dopant now being grown in accompany with the application of the X-rays and measuring intensity of the emitted fluorescent X-rays in relation to time; and control means for adjusting said film growing means on the basis of the measured values indicative of doping concentration of said thin film as measured by said fluorescent X-ray detecting measuring means.

* * * * *